United States Patent [19]
Kellogg

[11] 4,337,441
[45] Jun. 29, 1982

[54] SUPPLY-VOLTAGE DRIVER FOR A DIFFERENTIAL AMPLIFIER

[75] Inventor: James R. Kellogg, Hillsboro, Oreg.

[73] Assignee: Tektronix, Inc., Beaverton, Oreg.

[21] Appl. No.: 120,587

[22] Filed: Feb. 11, 1980

[51] Int. Cl.³ .............................................. H03F 3/45
[52] U.S. Cl. ..................................... 330/261; 330/297
[58] Field of Search ................. 330/69, 202, 252, 261, 330/297

[56] References Cited

U.S. PATENT DOCUMENTS

| | | | |
|---|---|---|---|
| 3,453,554 | 7/1969 | Shoemaker | 330/297 X |
| 3,478,275 | 11/1969 | Walker | 330/297 |
| 4,092,701 | 5/1978 | Bumgardner | 330/297 |

Primary Examiner—James B. Mullins
Attorney, Agent, or Firm—George T. Noe

[57] ABSTRACT

A supply voltage driver for one or more monolithic differential amplifiers sharing common power supplies comprises an additional monolithic differential amplifier operated as a voltage follower suspended between a current source and a current sink. Reference Zener diodes are coupled between the voltage follower output and the power supply terminals of the differential amplifiers to establish operating voltages which track an input signal. Additional current-boosting transistors are provided to provide fast slew rate during signal transitions. Overdrive circuitry is provided to limit the maximum and minimum signal levels.

10 Claims, 4 Drawing Figures

SUPPLY-VOLTAGE DRIVER FOR A DIFFERENTIAL AMPLIFIER

BACKGROUND OF THE INVENTION

Monolithic differential amplifiers have limited input and output dynamic ranges within which a signal must remain in order to prevent voltage breakdown or catastrophic failure due to high power levels. For years, the simple expedient has been to connect diode limiters directly to the input signal leads to protect the input stage. In amplifiers where a large output swing is needed, it has become a common practice to stack one or more transistors in arrangements known as totem poles between the supply voltages and output amplifier transistors to contemporaneously provide required voltage drops and the required dynamic range. However, totem pole arrangements in and of themselves have practical limitations which result in overdrive latchup, deterioration of slew rate and small-signal bandwidth, and may be prone to drift.

SUMMARY OF THE INVENTION

In accordance with the present invention, a supply-voltage driver for one or more monolithic differential amplifiers sharing common power supplies includes an additional monolithic differential amplifier operated as a voltage follower suspended between a current source and a current sink, both of which are preferably active devices, which in turn are connected respectively to suitable positive and negative power supply voltages. The supply-voltage driver differential amplifier is driven by the same input signal, or a component thereof, that is applied to the signal differential amplifier so that power supply voltage levels change as a function of the input signal. Current-control devices may be incorporated to increase slew rate from one level to another. This permits a substantial increase in the input dynamic range of the signal differential amplifier, without compromising small-signal bandwidth, stability, slew rate, input impedance, input offset, or open-loop gain.

Several embodiments of the supply-voltage driver of the present invention may be devised, depending upon the number and mode of operation of monolithic differential amplifiers operated by such supply-voltage driver, current requirements, expected input signal voltages, and the necessity of protection circuits.

It is therefore one object of the present invention to provide a supply-voltage driver which tracks an input signal, or component thereof, to provide suitably referenced supply voltages for one or more monolithic differential amplifiers.

It is another object to provide a supply-voltage driver for one or more monolithic differential amplifiers to permit an increase of the input signal dynamic range without compromising the small-signal bandwidth, stability, slew rate, input impedance, input offset, or open-loop gain.

It is an additional object to provide a supply-voltage driver for a monolithic differential amplifier which is capable of slewing equally well in either positive-going or negative-going directions over the dynamic range.

It is a further object to provide a supply-voltage driver for a monolithic differential amplifier wherein the supply-voltage driver incorporates overdrive circuitry.

Other objects and advantages will become apparent to those having ordinary skill in the art upon a reading of the following description when taken in conjunction with the accompanying drawings.

DETAILED DESCRIPTION OF THE INVENTION

Figure 1:
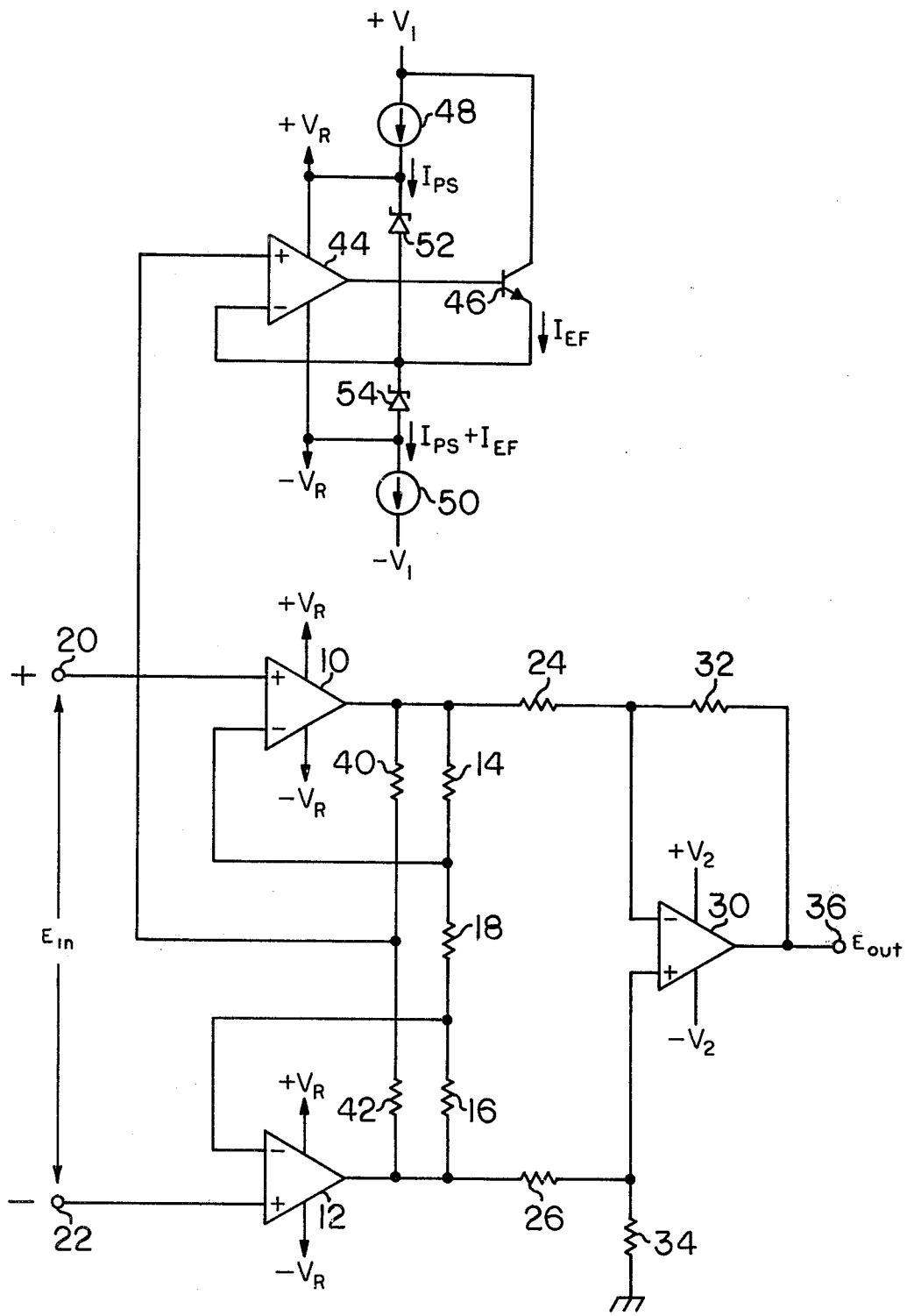
FIG. 1 shows a simplified schematic diagram of a supply-voltage driver which tracks the common-mode input signal applied to a differential amplifier.

Turning now to FIG. 1 of the drawings, there is shown a differential amplifier having a differential voltage follower input comprising a pair of commercially-available monolithic differential amplifiers 10 and 12, each having an inverting (−) input, a non-inverting (+) input, and an output. The outputs of amplifiers 10 and 12 are coupled to the − inputs thereof via resistors 14 and 16 respectively, and such − inputs are coupled together via a resistor 18. The + inputs of amplifiers 10 and 12 are connected to input terminals 20 and 22 respectively, across which a differential input signal $E_{in}$ may be applied. The outputs of the voltage-follower amplifiers 10 and 12 are coupled via equal-valued resistors 24 and 26 to the − and + inputs respectively of a monolithic differential amplifier 30. The output of amplifier 30 is connected to its − input via a feedback resistor 32, and the + input thereof is connected to ground via a resistor 34 having a value equal to that of resistor 32. A differential output signal $E_{out}$ is available at an output terminal 36.

The input signal $E_{in}$ may include a common-mode component as well as a differential component. That is, while there is a difference signal between terminals 20 and 22 to be amplified, there may be a common reference voltage applied simultaneously to terminals 20 and 22. One example of a common-mode signal is a 60-hertz line voltage sine wave applied to both inputs. Equal-valued resistors 40 and 42 are serially connected between the outputs of amplifiers 10 and 12, and the common-mode component of the input signal is picked off between such resistors and applied to the + input of a monolithic differential amplifier 44, which is operated as a voltage follower to track the common-mode signal. The output of amplifier 44 is coupled to the base of a current-control emitter-follower transistor 46, the emitter of which is coupled to the − input of amplifier 44. The positive power supply terminal of amplifier 44 is connected through a current source 48 to a suitable positive-voltage power supply $+V_1$. The negative power supply terminal of amplifier 44 is connected through a current sink 50 to a suitable negative-voltage power supply $-V_1$. It should be pointed out that the positive power supply terminals of amplifiers 44, 10, and 12 are connected together, and, likewise, the negative power supply terminals thereof are connected together. Operating reference voltages of $+V_R$ and $-V_R$ with respect to the − input of amplifier 44 are established by Zener diodes 52 and 54. Thus the three monolithic differential amplifiers 44, 10, and 12 have the same operating voltage and share the operating current $I_{PS}$. Through the voltage follower action of amplifier 44, the reference voltages $+V_R$ and $-V_R$ track the input common-mode signal over a dynamic range between $+V_1$ and $-V_1$. Transistor 46 ensures a rapid slew rate in the positive direction, since a positive-going signal at its base decreases the collector-to-emitter resistance thereof, increasing the current $I_{EF}$. Therefore, it can be seen that large common-mode signals with small differential signals superimposed thereon may be applied to the input terminals 20 and 22 without voltage breakdown of the input transistors. Further, the configuration permits the supply-voltage driver to act collaterally with the differential amplifier system so that there is no compromise or reduction in small-signal bandwidth, amplifier stability, slew rate, input impedance, input offset, or open-loop gain.

Figure 2:
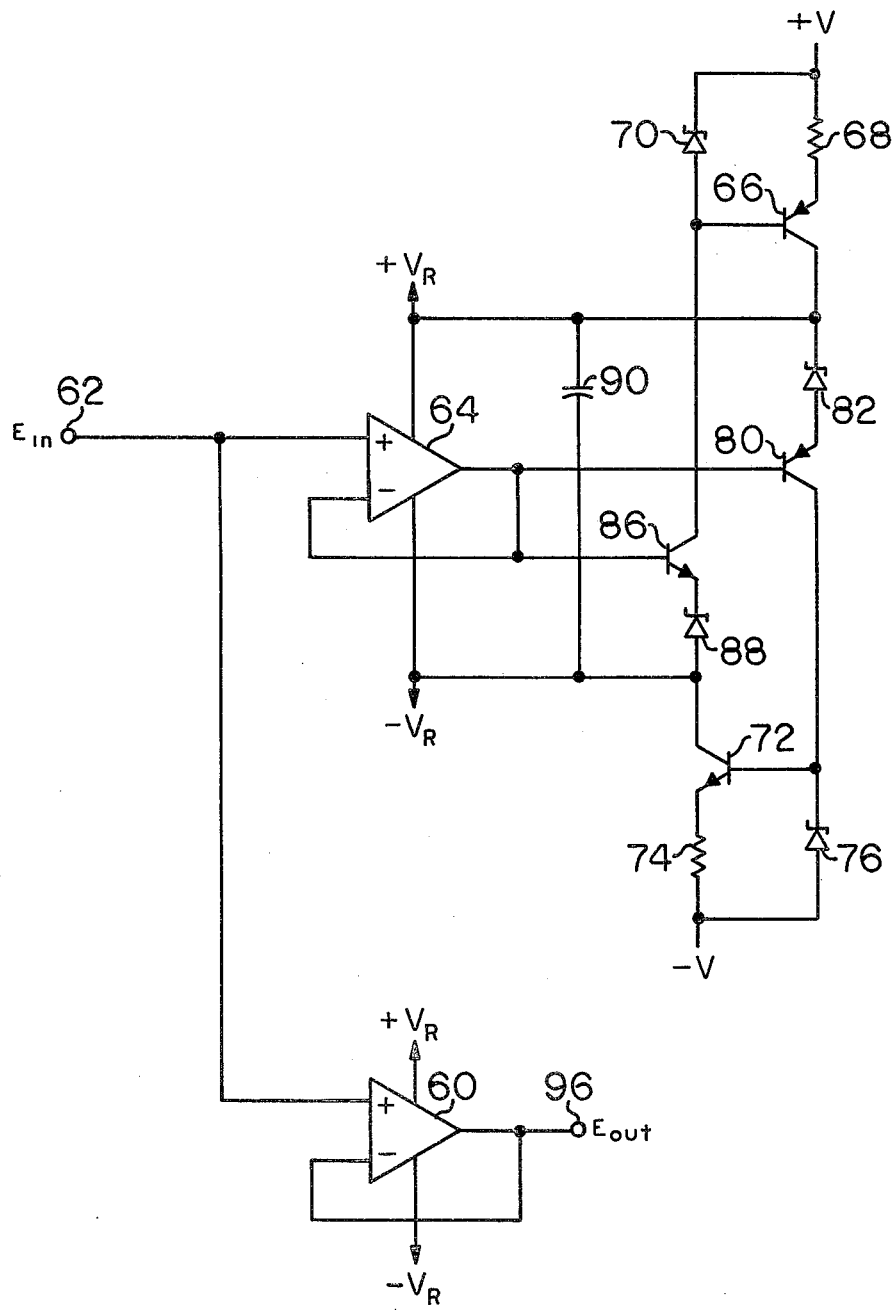
FIG. 2 is a detailed schematic diagram of a supply-voltage driver in accordance with the present invention.

A detailed schematic diagram of a supply-voltage driver circuit is shown in FIG. 2. For simplicity, the details of an actual amplifier for which the reference voltages $+$ and $-V_R$ are being provided are limited to a single monolithic differential amplifier 60 connected as a voltage follower. However, it is to be understood that amplifier 60 may be a part of a larger amplifier system such as the type shown in FIG. 1. An input signal $E_{in}$ is applied via an input terminal 62 to the $+$ inputs of amplifier 60 and the voltage-supply driver monolithic differential amplifier 64. Amplifier 64 is connected as a voltage follower in that the output thereof is connected to $-$ input. The current source comprises a transistor 66, the emitter of which is connected to a suitable source of positive voltage $+V$ through a current-setting resistor 68. A Zener diode 70 is connected between the voltage source $+V$ and the base of transistor 66 to establish a stable bias voltage for the current source. In a similar manner, the current sink comprises a transistor 72, the emitter of which is connected to a suitable source of negative voltage $-V$ through a current-setting resistor 74. A Zener diode 76 is connected between the voltage source $-V$ and the base of transistor 72 to establish a stable bias voltage for the current sink.

A first current-control emitter follower transistor 80 has the base thereof connected to the output of amplifier 64, the collector thereof connected to the cathode of Zener diode 76, and the emitter thereof connected through a Zener diode 82 to the collector of transistor 66. The base-emitter junction of transistor 80 and Zener diode 82 establish the positive reference voltage $+V_R$, which is connected to the positive power supply terminals of monolithic differential amplifiers 64 and 60.

A second current-control emitter follower transistor 86 has the base thereof connected to the output of amplifier 64, the collector thereof connected to the anode of Zener diode 70, and the emitter thereof connected through a Zener diode 86 to the collector of transistor 72. The base-emitter junction of transistor 86 and Zener diode 88 establish the negative reference voltage $-V_R$, which is connected to the negative power supply terminals of monolithic differential amplifiers 64 and 60. A large capacitor 90 is connected across the $+$ and $-V_R$ reference points to ensure a stable, constant voltage across the amplifier power supply terminals under dynamic conditions.

In operation, incremental changes in $E_{in}$ are reproduced at the output of amplifier 64 through voltage follower action, and are reproduced at the positive and negative power supply terminals of amplifiers 64 and 60 through the emitter follower action of transistors 80 and 86. An output voltage $E_{out}$ is available at an output terminal 96. The supply-voltage driver embodiment of FIG. 2 exhibits little or no tendency to latch up at very high slew rates and will slew equally well in either direction because of the current control transistors 80 and 86.

Figure 3:
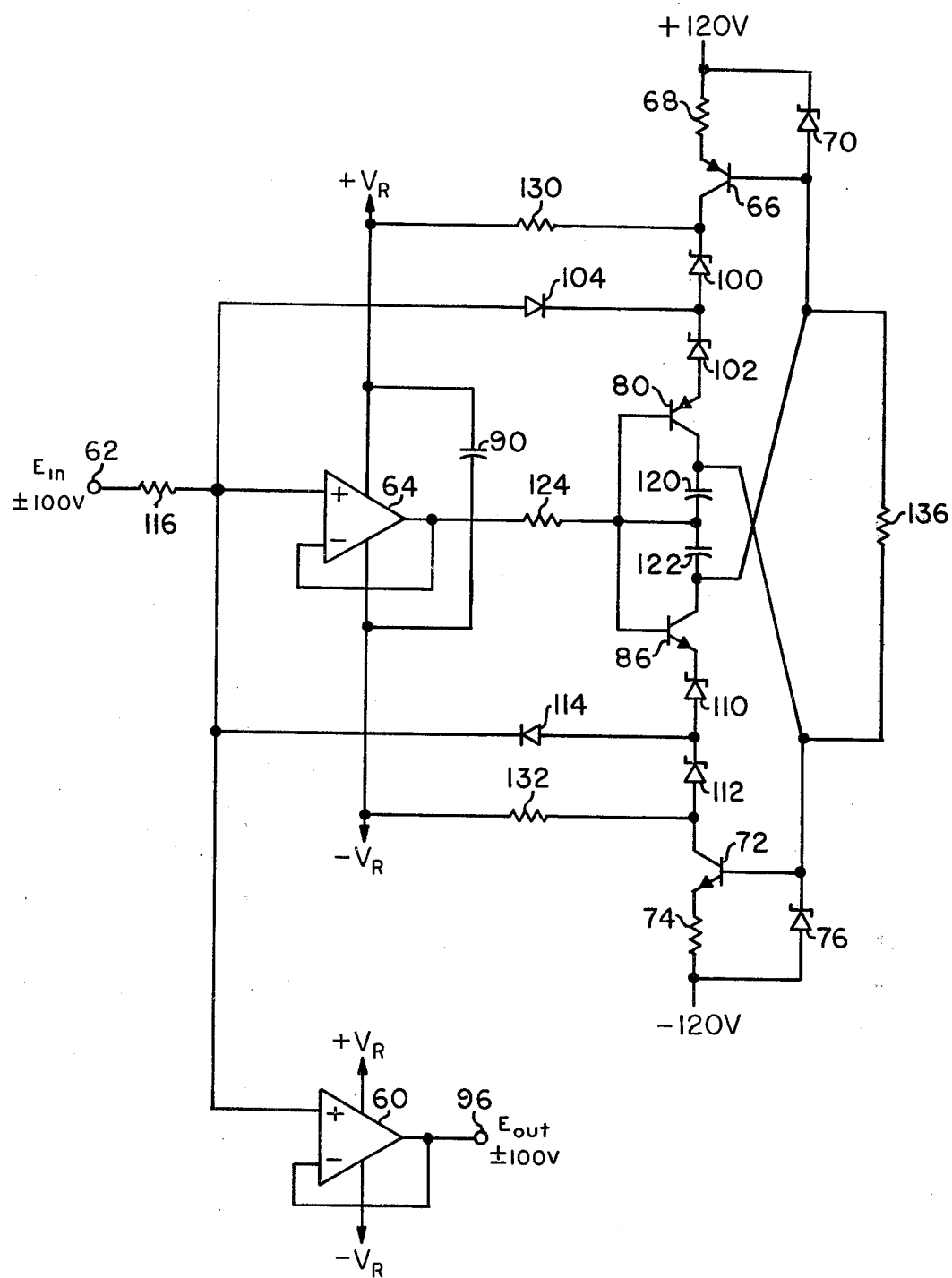
FIG. 3 is a detailed schematic diagram of a supply-voltage driver incorporating overdrive circuitry.

FIG. 3 shows a detailed schematic of a supply-voltage driver incorporating overdrive circuitry. Components which are the same as those described in connection with FIG. 2 have the same reference numerals as those described earlier, and since their function is not changed, only the overdrive circuit components will be described. In this embodiment, Zener diode 82 is replaced by a pair of Zener diodes 100 and 102 connected in series, with the cathode of a diode 104 connected therebetween. The anode of diode 104 is connected to the $+$ input of amplifier 64. In this particular circuit, diode 104 limits the positive-going excursion at the $+$ input of amplifier 64 to about $+100$ volts. In a like manner, Zener diode 88 is replaced by a pair of Zener diodes 110 and 112 connected in series, with the anode of a diode 114 connected therebetween. The cathode of diode 114 is connected to the $+$ input of amplifier 64. Diode 114 limits the negative-going excursion at the $+$ input of amplifier 64 to about $-100$ volts. A resistor 116 may be inserted into the input signal path between input terminal 62 and the $+$ input of amplifier 64 to allow even greater voltage swings of $E_{in}$, and voltage excursions of $E_{in}$ beyond the supply rails, i.e., $\pm 120$ volts as shown, may be tolerated if the value of R116 is chosen to limit the input current to a value within the rating of diodes 104 and 114 and the power rating or resistor 116. Capacitors 120 and 122, connected from base to collector of transistors 80 and 86 respectively, and resistor 124, connected between the output of amplifier 64, and the bases of transistors 80 and 86, may be added for suppression of oscillation or ringing. Resistors 130 and 132 may be added to provide series current limiting in the event of failure of any of the semiconductor devices in the series path between the $+$ and $-120$-volt supplies. A large-valued resistor 136 may be added between the bases of transistors 66 and 72 to ensure a minimal conduction of Zener diodes 70 and 76.

Figure 4:
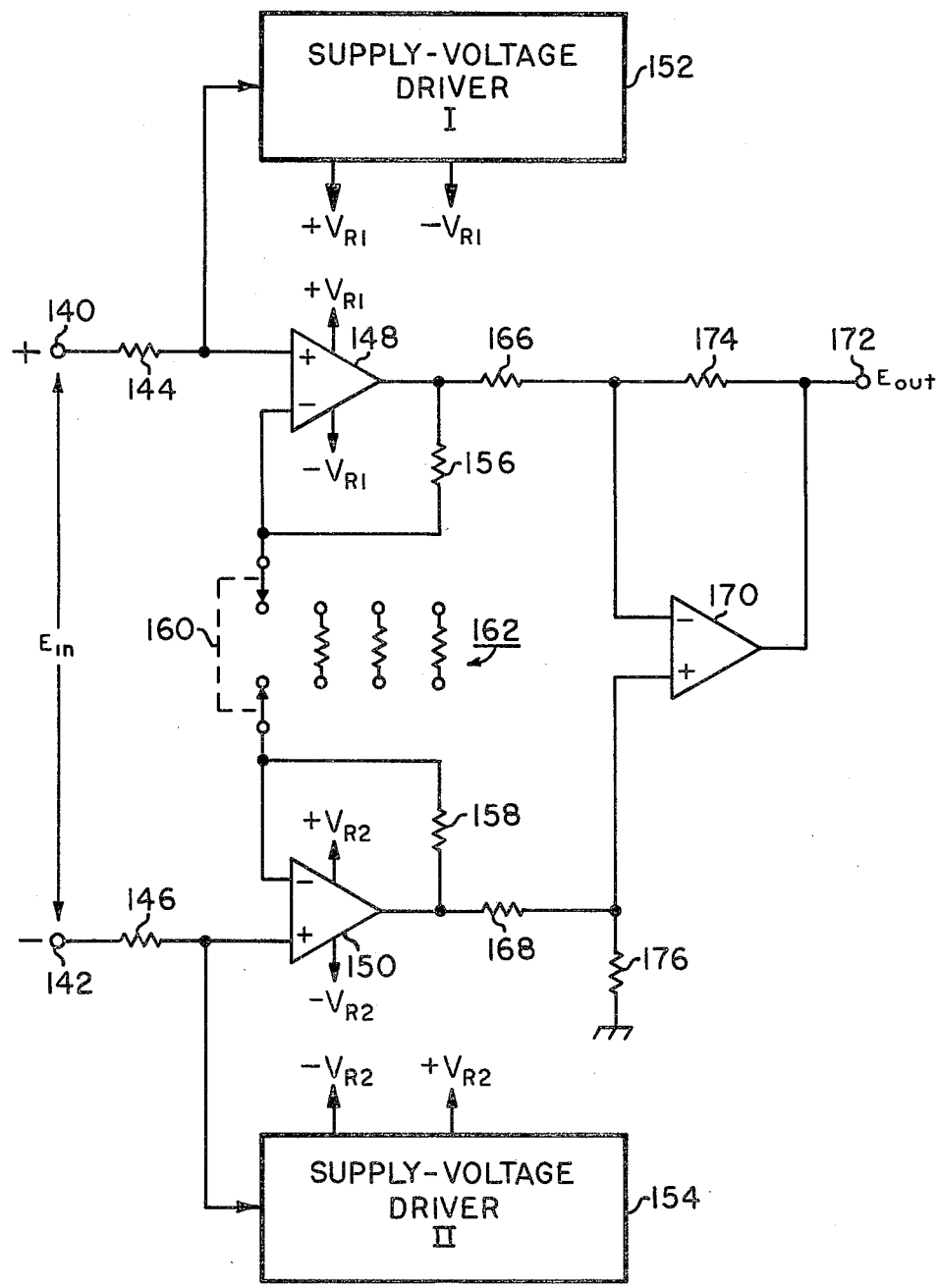
FIG. 4 is a schematic diagram of a differential instrumentation amplifier incorporating a pair of supply-voltage drivers.

A gain-switched differential instrumentation amplifier circuit incorporating a pair of supply-voltage drivers as hereinabove described is shown in FIG. 4. An input signal $E_{in}$ is applied across a pair of input terminals 140 and 142, and applied via resistors 144 and 146 to the $+$ inputs of monolithic differential amplifiers 148 and 150, respectively. The signal at the $+$ input of amplifier 148 is also applied to a first supply-voltage driver 152, which produces supply voltages $+$ and $-V_{R1}$ for amplifier 148. Similarly, the signal at the $-$ input of amplifier 150 is applied to a second supply-voltage driver 154, which produces supply voltages $+$ and $-V_{R2}$ for amplifier 150. Amplifiers 148 and 150 are connected as voltage followers, and include equal-valued resistors 156 and 158 respectively connected between the outputs and $-$ inputs. A switch 160 permits a plurality of divider resistors 162 to be selectively connected between the $-$ inputs of amplifiers 148 and 150 to set the input gain. The outputs of the voltage-follower amplifiers 148 and 150 are coupled via equal-valued resistors 166 and 168 to the $-$ and $+$ inputs respectively of a monolithic differential amplifier 170. The output of amplifier 170 is connected to an output terminal 172, and a feedback resistor 174 is connected from the output to the − input of amplifier 170. The + input of amplifier 170 is connected to ground via a resistor 176 having a value equal to that of resistor 174.

To the extent that the input signal $E_{in}$ is a common-mode signal, both supply-voltage drivers 152 and 154 respond equally. However, this configuration permits the supply-voltage drivers 152 and 154 to track the input voltage at their own respective inputs, and therefore amplifiers 148 and 150 receive respective supply voltages which track the actual signal voltage at their respective + inputs. This is particularly useful when a single-ended input signal is applied to either input terminal 140 or 142 with the other input terminal grounded.

It will therefore be appreciated that the aformentioned and other desirable objects have been achieved; however, it should be noted that the particular embodiments of the invention which are shown and described herein are intended merely as illustrative and not as restrictive of the invention.

What I claim as being novel is:

1. A supply-voltage driver for a first differential amplifier having positive and negative supply voltage terminals, comprising:
    a second differential amplifier having positive and negative supply voltage terminals connected respectively to the positive and negative supply voltage terminals of said first differential amplifier, said second differential amplifier also having a first input, a second input, and an output, the output being coupled to said second input;
    a current source coupled to said positive supply voltage terminals;
    a current sink coupled to said negative supply voltage terminals;
    first reference voltage means coupled from said output to said positive supply voltage terminals;
    second reference voltage means coupled from said output to said negative supply voltage terminals;
    means for applying an input signal to said first differential amplifier and at least a portion of said input signal to said second differential amplifier; and
    overdrive protection means to limit the input signal to predetermined maximum and minimum values, said overdrive protection means comprising first and second diodes coupled from said first input to said second differential amplifier respectively to said first and second reference voltage means.

2. A supply-voltage driver in accordance with claim 1 further comprising current-control means coupled to the output of said second differential amplifier to provide additional current during signal transitions to provide fast slewing of said reference voltage means to track said input signal.

3. A supply voltage driver in accordance with claim 2 wherein said current-control means comprises a first transistor biased in a first sense to provide additional current during negative-going signal transitions and a second transistor biased in a second sense to provide additional current during positive-going signal transitions.

4. A supply voltage driver in accordance with claim 1 wherein said current source and said current sink comprise oppositely-poled transistors, the emitters of which are coupled through impedance elements to respective first and second power supply voltages, and the collectors of which are coupled respectively to said positive and negative supply voltage terminals.

5. A supply voltage driver in accordance with claim 1 wherein said first and second reference voltage means comprise Zener diodes.

6. A supply-voltage driver for a first differential amplifier having positive and negative supply voltage terminals, comprising:
    a second differential amplifier having positive and negative supply voltage terminals connected respectively to the positive and negative supply voltage terminals of said first differential amplifier, said second differential amplifier also having a first input, a second input, and an output, the output being coupled to said second input;
    a current source coupled to said positive supply voltage terminals;
    a current sink coupled to said negative supply voltage terminals;
    first reference voltage means coupled from said output to said positive supply voltage terminals;
    second reference voltage means coupled from said output to said negative supply voltage terminals;
    means for applying an input signal to said first differential amplifier and at least a portion of said input signal to said second differential amplifier; and
    current-control means coupled between the output of said second differential amplifier and said first and second reference voltage means to provide additional current during signal transitions to provide fast slewing of said reference voltage means to track said input signal.

7. A supply voltage driver in accordance with claim 6 wherein said current-control means comprises a first transistor biased in a first sense to provide additional current during negative-going signal transitions and a second transistor biased in a second sense to provide additional current during positive-going signal transitions.

8. A supply voltage driver in accordance with claim 6 wherein said current source and said current sink comprise oppositely-poled transistors, the emitters of which are coupled through impedance elements to respective first and second power supply voltages, and the collectors of which are coupled respectively to said positive and negative supply voltage terminals.

9. A supply voltage driver in accordance with claim 7 wherein said first and second reference voltage means comprise Zener diodes.

10. A supply voltage driver in accordance with claim 7 further comprising overdrive protection means to limit the input signal to predetermined maximum and minimum values, said overdrive protection means comprising first and second diodes coupled from said first input of said second differential amplifier respectively to said first and second reference voltage means.

* * * * *

UNITED STATES PATENT AND TRADEMARK OFFICE
CERTIFICATE OF CORRECTION

PATENT NO. : 4,337,441
DATED : June 29, 1982
INVENTOR(S) : James R. Kellogg

It is certified that error appears in the above—identified patent and that said Letters Patent is hereby corrected as shown below:

Col. 4, line 34, change "or" to --of--.

Col. 6, line 53, change "claim 7" to --claim 6--.

Col. 6, line 56, change "claim 7" to --claim 6--.

Signed and Sealed this

Twenty-sixth Day of October 1982

[SEAL]

Attest:

GERALD J. MOSSINGHOFF

Attesting Officer

Commissioner of Patents and Trademarks